US008709371B2

(12) United States Patent
Fujito et al.

(10) Patent No.: US 8,709,371 B2
(45) Date of Patent: Apr. 29, 2014

(54) METHOD FOR GROWING GROUP III-NITRIDE CRYSTALS IN SUPERCRITICAL AMMONIA USING AN AUTOCLAVE

(75) Inventors: Kenji Fujito, Ibaraki (JP); Tadao Hashimoto, Goleta, CA (US); Shuji Nakamura, Santa Barbara, CA (US)

(73) Assignees: The Regents of the University of California, Oakland, CA (US); Japan Science and Technology Agency, Kawaguchi, Saitama Prefecture (JP)

( * ) Notice: Subject to any disclaimer, the term of this patent is extended or adjusted under 35 U.S.C. 154(b) by 467 days.

(21) Appl. No.: 11/921,396

(22) PCT Filed: Jul. 8, 2005

(86) PCT No.: PCT/US2005/024239
§ 371 (c)(1),
(2), (4) Date: Nov. 30, 2007

(87) PCT Pub. No.: WO2007/008198
PCT Pub. Date: Jan. 18, 2007

(65) Prior Publication Data
US 2010/0158785 A1   Jun. 24, 2010

(51) Int. Cl.
*C01B 21/06* (2006.01)
*C30B 23/00* (2006.01)
*C30B 25/00* (2006.01)
*C30B 28/12* (2006.01)
*C30B 28/14* (2006.01)

(52) U.S. Cl.
USPC ............................................. 423/409; 117/84

(58) Field of Classification Search
USPC .......................................................... 117/84
See application file for complete search history.

(56) References Cited

U.S. PATENT DOCUMENTS 6,656,615 B2 * 12/2003 Dwilinski et al. ............ 428/698
7,081,162 B2    7/2006 Dwilinski et al.
(Continued)

FOREIGN PATENT DOCUMENTS

EP       1770189      4/2007
JP       2003-40699   2/2003
(Continued)

OTHER PUBLICATIONS

European Search Report dated Jul. 30, 2009, Application No. EP 05769394.7, PCT/US2005/024239.
(Continued)

*Primary Examiner* — Melvin C Mayes
*Assistant Examiner* — Michael Forrest
(74) *Attorney, Agent, or Firm* — Gates & Cooper LLP (57) ABSTRACT

A method of growing high-quality, group-III nitride, bulk single crystals. The group III-nitride bulk crystal is grown in an autoclave in supercritical ammonia using a source material or nutrient that is a group III-nitride polycrystals or group-III metal having a grain size of at least 10 microns or more and a seed crystal that is a group-III nitride single crystal. The group III-nitride polycrystals may be recycled from previous ammonothermal process after annealing in reducing gas at more then 600° C. The autoclave may include an internal chamber that is filled with ammonia, wherein the ammonia is released from the internal chamber into the autoclave when the ammonia attains a supercritical state after the heating of the autoclave, such that convection of the supercritical ammonia transfers source materials and deposits the transferred source materials onto seed crystals, but undissolved particles of the source materials are prevented from being transferred and deposited on the seed crystals.

15 Claims, 11 Drawing Sheets

(56) References Cited

U.S. PATENT DOCUMENTS

| | | | |
|---|---|---|---|
| 7,364,619 | B2 | 4/2008 | Dwilinski et al. |
| 7,374,615 | B2 | 5/2008 | Dwilinski et al. |
| 7,422,633 | B2 | 9/2008 | Dwilinski et al. |
| 2002/0192507 | A1 | 12/2002 | Dwilinski et al. |
| 2003/0141301 | A1* | 7/2003 | D'Evelyn et al. .......... 220/62.11 |
| 2003/0209191 | A1* | 11/2003 | Purdy .............................. 117/84 |
| 2004/0124434 | A1* | 7/2004 | D'Evelyn et al. ............. 257/103 |
| 2005/0098095 | A1 | 5/2005 | D'Evelyn et al. |

FOREIGN PATENT DOCUMENTS

| | | |
|---|---|---|
| JP | 2004002152 | 2/2004 |
| JP | 2004-533391 | 11/2004 |
| JP | 2005008444 | 1/2005 |
| TW | 546272 | 8/2003 |
| TW | 569471 | 1/2004 |
| TW | 588016 | 5/2004 |
| WO | 2004-061923 | 7/2004 |

OTHER PUBLICATIONS

Aoki, M. et al., "GaN single crystal growth using high-purity Na as a flux," Journal of Crystal Growth 242, 2002, pp. 70-76.

Chen, Q. et al., "Modeling of ammonothermal growth of nitrides," Journal of Crystal Growth 258, 2003, pp. 181-187.

Dwilinski, R. et al., "Ammono method of BN, AlN and GaN synthesis and crystal growth," MRS Internet J. Nitride Semicond. Res. 3, 25, 1998, pp. 1-4.

Dwilinski, R. et al., "Ammono method of GaN and AlN production," Diamond and Related Materials 7, 1998, pp. 1348-1350.

Hashimoto, T. et al., "Ammonothermal growth of GaN on an over-1-inch seed crystal," Japanese Journal of Applied Physics, vol. 44, No. 52, 2005, pp. L1570-L1572.

Hashimoto, T. et al., "Phase selection of microcrystalline GaN synthesized in supercritical ammonia," Journal of Crystal Growth 291, 2006, pp. 100-106.

Hashimoto, T. et al., "Structural characterization of thick GaN films grown on free-standing GaN seeds by the ammonothermal method using basic ammonia," Japanese Jouranl of Applied Physics, vol. 25, 2005, pp. L797-L799.

Inoue, T. et al., "Pressure-controlled solution growth of bulk GaN crystals under high pressure," Phys. Stat. Sol. (b), 223, 2001, pp. 15-27.

Iwahashi, T. et al., "Effects of ammonia gas on threshold pressure and seed growth for bulk GaN single crystals by Na flux method," Journal of Crystal Growth, 253, 2003, pp. 1-5.

Ketchum, D. et al., "Crystal growth of gallium nitride in supercritical ammonia," Journal of Crystal Growth, 222, 2001, pp. 431-434.

Ohshima, E. et al, "Growth of the 2-in-size bulk ZnO single crystals by the hydrothermal method," Journal of Crystal Growth 260, 2004, pp. 166-170.

Peters, D., "Ammonothermal synthesis of aluminum nitride," Journal of Crystal Growth, 104, 1990, pp. 411-418.

Porowski, S., "Near defect free GaN substrates," MRS Internet Journal of Nitride Semiconductor, Res. 4S1, 1999, G1.3, 11 pages.

Purdy, A. et al., "Ammonothermal recrystallization of gallium nitride with acidic mineralizers," Cryst. Growth Design, 2, 2002, pp. 141-145.

Taiwanese Office Action dated Sep. 12, 2012 for TW application No. 095124931.

Japanese Office Action dated Sep. 8, 2011, Application No. 2008-520225, with translation.

Taiwanese Notice of Allowance dated Apr. 30, 2013 for Taiwanese Patent Application No. 095124931.

EPO Communication dated Feb. 9, 2012 for EP application No. 05769394.7 filed Jul. 8, 2005.

EP Communication dated Jul. 24, 2012 for EP application No. 05769394.7.

* cited by examiner

METHOD FOR GROWING GROUP III-NITRIDE CRYSTALS IN SUPERCRITICAL AMMONIA USING AN AUTOCLAVE

BACKGROUND OF THE INVENTION

1. Field of the Invention

The invention is related to the growth of Group-III nitride crystals, and more particularly, to the growth of Group-III nitride crystals in supercritical ammonia using an autoclave.

2. Description of the Related Art (Note: This application references a number of different publications and patents as indicated throughout the specification by one or more reference numbers within brackets, e.g., [x]. A list of these different publications and patents ordered according to these reference numbers can be found below in the section entitled "References." Each of these publications and patents is incorporated by reference herein.)

The usefulness of gallium nitride (GaN) and its ternary and quaternary alloys incorporating aluminum and indium (AlGaN, InGaN, AlInGaN) has been well established for fabrication of visible and ultraviolet optoelectronic devices and high-power electronic devices. These devices are typically grown epitaxially on heterogeneous substrates, such as sapphire and silicon carbide since GaN wafers are not yet available. The heteroepitaxial growth of group III-nitride causes highly defected or even cracked films, which deteriorate the performance and reliability of these devices.

In order to eliminate the problems arising from the heteroepitaxial growth, group III-nitride wafers sliced from bulk crystals must be used. However, it is very difficult to grow a bulk crystal of group III-nitride, such as GaN, AlN, and InN, since group III-nitride has a high melting point and high nitrogen vapor pressure at high temperature.

Up to now, a couple of methods, such as high-pressure high-temperature synthesis [1,2] and sodium flux [3,4], have been used to obtain bulk group III-nitride crystals. However, the crystal shape obtained by these methods is a thin platelet because these methods are based on a melt of group III metal, in which nitrogen has very low solubility and a low diffusion coefficient.

A new technique called ammonothermal growth has the potential for growing large bulk group III-nitride crystals, because supercritical ammonia used as a fluid has high solubility of source materials, such as group III-nitride polycrystals or group III metal, and has high transport speed of dissolved precursors. This ammonothermal method [5-9] has a potential of growing large bulk group III-nitride crystals.

However, in the previously disclosed technique, there was no quantitative assessment for the grain size of the source material. If GaN or AlN is chosen as a source material, the only commercially available form is a powder of a size less than 10 microns, and usually 0.1~1 microns. This small powder is easily blown by the convective flow of supercritical ammonia and transported onto the seed crystals, resulting in polycrystalline growth.

The main idea of the ammonothermal growth is taken from a successful mass production of artificial quartz by hydrothermal growth. In the hydrothermal growth of artificial quartz, an autoclave is divided into two regions: a top region and a bottom region. Source material, known as the nutrient, such as polycrystalline $SiO_2$, is placed in the bottom region and seed crystals, such as single crystalline $SiO_2$, are placed in the top region. The autoclave is filled with water and a small amount of chemicals known as mineralizers are added to the water to increase the solubility of $SiO_2$. Sodium hydroxide or sodium carbonate is a typical mineralizer. In addition, the temperature in the bottom region is kept higher than that in the top region.

In the case of ammonothermal growth, ammonia is used as a fluid. It is challenging to fill the autoclave with liquid ammonia safely, without contamination. In particular, oxygen is a detrimental impurity source in ammonothermal growth. Both the ammonia and mineralizers favor oxygen and moisture. Therefore, it is very important to load all solid sources and ammonia in an air-free environment.

Another important issue is the boiling point of ammonia. In the case of hydrothermal growth, water is in a liquid phase at room temperature. However, ammonia is in a gas phase at room temperature and the vapor pressure at room temperature is about 150 psi. It is necessary to cool the autoclave and condense gaseous ammonia to fill liquid ammonia into an autoclave or an internal chamber.

When the size of the autoclave is small (e.g., small enough to fit in a glove-box), all solid sources (i.e., nutrient, mineralizers, seed crystals, etc.) can be loaded into the autoclave in a glovebox, and ammonia can be condensed in the autoclave by cooling the entire autoclave. However, when the autoclave is large (e.g., too large to fit in a glove-box), it is practically very difficult to cool the entire autoclave to condense the ammonia.

These difficulties can be solved by using an internal chamber within the autoclave. However, use of an internal chamber creates another problem, which is to balance pressure inside and outside of the internal chamber.

Notwithstanding the above, what is needed in the art are new methods for the growth of group-III nitride structures, as well as new apparatus for performing such methods. The present invention satisfies these needs.

SUMMARY OF THE INVENTION

The present invention discloses method for growing group III-nitride crystals. The method comprises: (a) loading source materials and seed crystals into a reaction vessel, wherein the source materials have a grain size of at least 10 microns; (b) filling the reaction vessel with ammonia; and (c) raising the reaction vessel's temperature to attain a supercritical state for the ammonia, wherein convection of the supercritical ammonia transfers the source materials and deposits the transferred source materials onto the seed crystals, but undissolved particles of the source materials are prevented from being transferred and deposited on the seed crystals.

Since large-sized group-III polycrystalline nutrient is very difficult to obtain, the present invention provides both a synthesis method for the polycrystalline nutrient and a recycling method for the nutrient.

The reaction vessel may be an autoclave and an internal chamber placed within the autoclave, wherein the internal chamber is filled with ammonia, the autoclave's temperature is raised, and the ammonia is released from the internal chamber into the autoclave when the ammonia attains a supercritical state, such that convection of the supercritical ammonia transfers source materials and deposits the transferred source materials onto seed crystals, but undissolved particles of the source materials are prevented from being transferred and deposited on the seed crystals.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention provides a method of growing high-quality group-III nitride single crystals in bulk, primarily group III nitride single crystals that include at least one of the group III elements B, Al, Ga, In and Tl, such as GaN, AlN and InN. The group III-nitride bulk crystal is grown in an autoclave in supercritical ammonia using a source material or nutrient that is a group III-nitride polycrystal or group-DI metal having a grain size of at least 10 microns or more and a seed crystal that is a group-III nitride single crystal. The supercritical ammonia provides for high solubility of the source materials and high transport speed of dissolved precursors.

Technical Description of the Method

Figure 1:
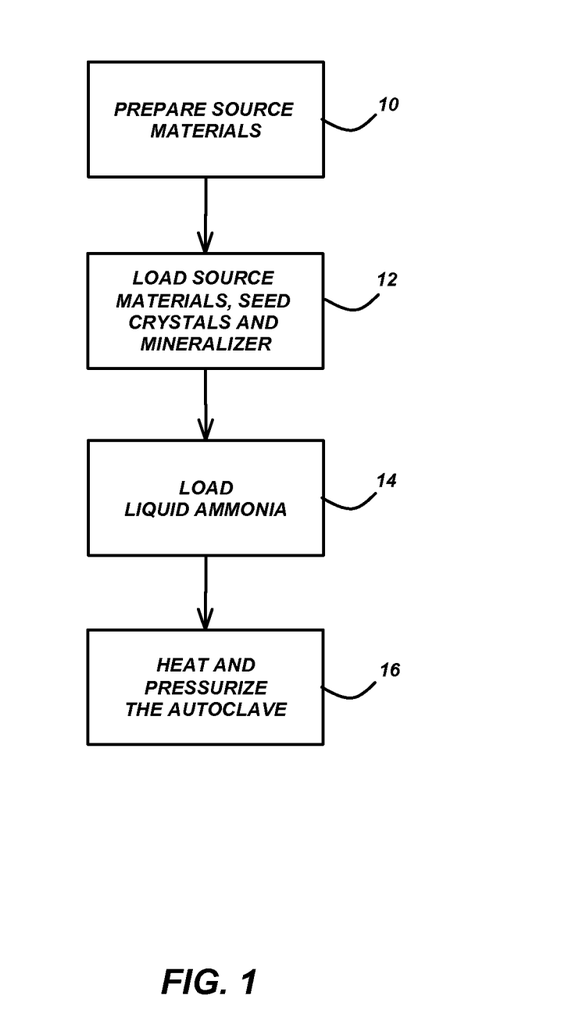
FIG. 1 is a flowchart that illustrate the process steps according to the preferred embodiment of the present invention.

FIG. 1 is a flowchart that illustrate the process steps according to the preferred embodiment of the present invention.

Block 10 represents preparing the source materials, which are group DI-nitride polycrystals synthesized from group III halides, or a group-III metal, or a mixture of group-III metal and group-III nitride polycrystals, wherein the group III-nitride is GaN. Preferably, the source materials have a grain size of at least 10 microns or more.

Any suitable synthesis techniques of group III-nitride polycrystals can be used. Group III-nitride polycrystalline source materials synthesized from group III halides are preferably used since this method easily yields polycrystals with a grain size larger than 10 microns. The group III-nitride polycrystals can be broken down into smaller pieces to increase their surface area, but the size must be at least 10 microns or more.

Conversely, III-nitride sintered pieces can also be used; however, the size of the each grain in the pieces must be at least 10 microns or more. This is because each grain of the sintered pieces easily come off from the pieces during dissolution, forming small particles of the source material. If the small particles formed have a size larger than 10 microns, they are not transported by convective flow onto the seed crystals. It is preferable to select the size of the source material with a sieve for the purposes of the present invention.

Using recycled crystals for the nutrient is also very important for reducing production costs. In an alternative embodiment, part or all of the source materials may be prepared in Block 10 by a recycling process for undissolved nutrient used in a previous ammonothermal process or fragments of the group III-nitride crystals grown in the previous ammonothermal process and produced during the cutting and gliding of the grown crystals, wherein the recycling process includes annealing the nutrients or the fragments at more than 600° C. in a reducing environment, such as hydrogen or ammonia. An acid rinse of the recycled nutrient is also effective to prevent accumulation of metal particles.

Block 12 represents loading the source materials, group-III nitride seed crystals, and at least one mineralizer into a reaction vessel, such as an autoclave, in a manner depending on crystallization conditions and the type of autoclave arrangement being used, as described in more detail below. In one example, the seed crystals are group-III nitride crystals, and $NaNH_2$ together with NaI are added as a mineralizer.

After placing the source material and the seed crystals into the reaction vessel, Block 14 represents filling the reaction vessel with liquid ammonia that are suitable for ammonothermal growth of crystals.

Block 16 represents raising the reaction vessel's temperature, so that it is spontaneously pressurized, to attain a supercritical state for the ammonia, wherein convection of the supercritical ammonia transfers the source materials and deposits the transferred source materials onto the seed crystals, but undissolved particles of the source materials are prevented from being transferred and deposited on the seed crystals. Specifically, by using source materials having a grain size of at least 10 microns or more, the transfer of source materials that are not dissolved in supercritical ammonia is restricted.

Finally, the typical process duration is 1 to 19 days, and the end result of the process is a group-III nitride crystal.

In one embodiment, the reaction vessel is an autoclave that has a longer dimension along the vertical direction, wherein the reaction vessel is divided into a top region and a bottom region with a baffle plate therebetween, the source materials and seed crystals are placed in separate ones of the top and bottom regions, and the top region is kept at a different temperature than the bottom region.

In another embodiment, the reaction vessel is an autoclave that has an internal chamber that is filled with ammonia either inside or outside of the autoclave. The internal chamber, when it is inside the autoclave, releases ammonia from the internal chamber into the autoclave at a certain pressure to balance the pressure between the inside and outside of the chamber. This pressure-releasing internal chamber enables the ammonia to fill up the space inside the autoclave easily and safely. Also, this pressure-releasing internal chamber avoids any unexpected rupture of the chamber, which could happen by pressure misbalancing in a conventional internal chamber.

These embodiments are described in more detail below.

Technical Description of the Autoclave

Figure 2:
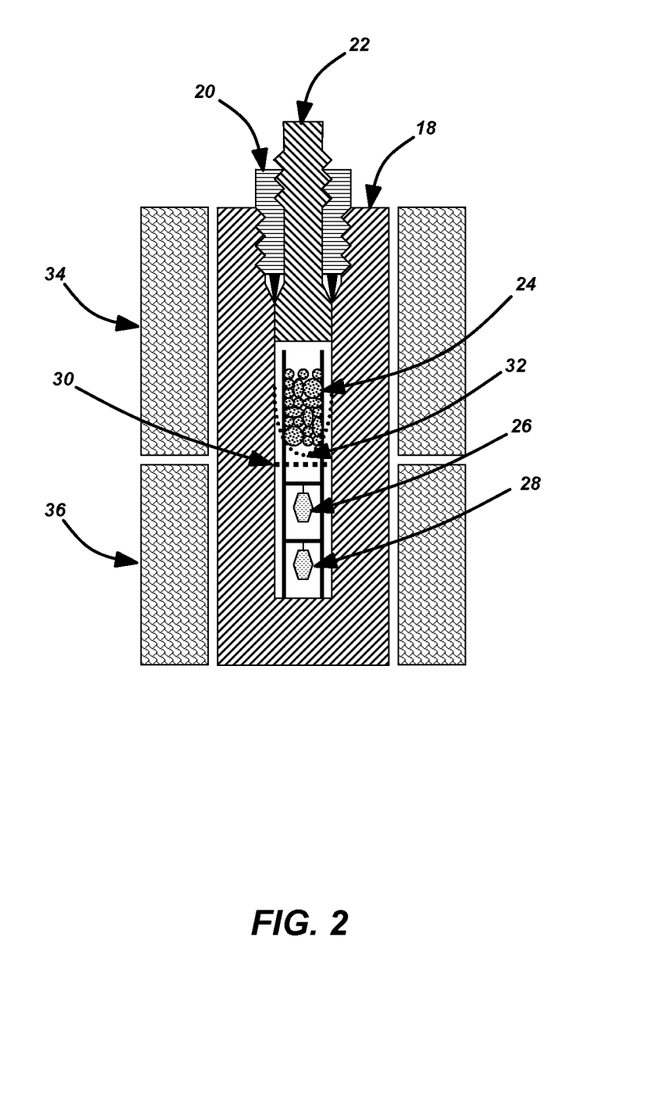
FIG. 2 is schematic cross-section that illustrates an exemplary autoclave according to the preferred embodiment of the present invention.

FIG. 2 is schematic cross-section that illustrates an exemplary autoclave according to the preferred embodiment of the present invention. The autoclave 18 includes a threaded inlet 20 and plug 22, and is divided into two regions: a top region where the source materials 24 are placed and a bottom region where the seed crystals 26 and 28 are placed, with a baffle 30 therebetween to create a temperature distribution between the top region and bottom region.

Those skilled in the art will recognize that the placement of the source materials 24 and seed crystals 26, 28 may be reversed, with the source materials 24 placed in the bottom region and the seed crystals 26, 28 placed in the top region, so long as they are separately placed in either region of the autoclave 18.

The source materials 24 may be held in a mesh basket 32. The mesh basket 32 is preferably made of Ni or a Ni-based alloy that contains at least 30% of Ni, although any suitable mesh basket 32 can be used for the purposes of the present invention.

The autoclave 18 is filled with at least one mineralizer and liquid ammonia, and then heated using separate heaters 34 and 36 for the top and bottom regions, so that the ammonia is in a supercritical state. Preferably, the temperature in the bottom region is different than the temperature in the top region so that a convection of supercritical ammonia then occurs in the autoclave 18.

As noted above, by using source materials 24 having a grain size of at least 10 microns or more, the transfer of source materials 24 that are not dissolved in supercritical ammonia is restricted. Specifically, the present invention prevents undissolved particles of the source materials 24 from being transferred and deposited on the seed crystals 26, 28.

Prior art autoclaves [10], e.g., a bench top autoclave having a diameter of about 1.5 inches and a height of about 6 inches, may be used in this invention, although they are generally considered too small. For production of crystals, however, the internal volume of an autoclave should be large enough to grow many crystalline boules at a same time, e.g., at least a medium-sized autoclave having a diameter of about 1 feet and a height of about 2 feet.

Alternatively, it may be preferable to use an autoclave with a removable or non-removable internal chamber. In such an arrangement, the internal chamber is used to: (1) fill ammonia easily and safely; (2) load oxygen-sensitive and moisture-sensitive mineralizers; and (3) reduce impurities from the autoclave's walls.

An example of an internal chamber used in a small autoclave is shown in [11]. The internal chamber is made of quartz and the pressure balance was maintained by filling water into a space between the autoclave and the quartz internal chamber.

Another example of an internal chamber is described in [12], in which high-purity ZnO boules are grown in hydrothermal growth with a Pt liner chamber. Similar to [11], the pressure balance is maintained by filling water to space between the Pt liner and an autoclave.

However, in both of these autoclaves, it is very difficult to maintain a pressure balance, because the pressure of supercritical ammonia at high temperature is not well known, and the volume between the internal chamber and the autoclave cannot be precisely determined. In addition, an internal chamber may rupture unexpectedly due to the large pressure differences between the inside and outside of the internal chamber.

The following describes alternative embodiments having an internal chamber that is placed within an autoclave, wherein the internal chamber is filled with ammonia, the autoclave's temperature is raised, and the ammonia is released from the internal chamber into the autoclave when the ammonia attains a supercritical state, such that convection of the supercritical ammonia transfers source materials and deposits the transferred source materials onto seed crystals, but undissolved particles of the source materials are prevented from being transferred and deposited on the seed crystals.

Preferably, the internal chamber is leak tight when filled with ammonia and the internal chamber releases ammonia when it is inside the autoclave. When an internal chamber is placed inside an autoclave, preferably there exists some space between the outer walls of the internal chamber and the inner walls of the autoclave, which is filled with the ammonia.

The internal chamber may be equipped with a valve that is mechanically opened when the internal chamber is inside the autoclave. Alternatively, the internal chamber may be equipped with a pressure-releasing mechanism that is activated by pressure or temperature. The pressure-releasing mechanism may comprise a rupture disk assembly that ruptures at a high pressure, a fitting seal that leaks at a high pressure, or a metal seal that melts at a low temperature. Each of these different embodiments are described in more detail below.

Figure 3A:
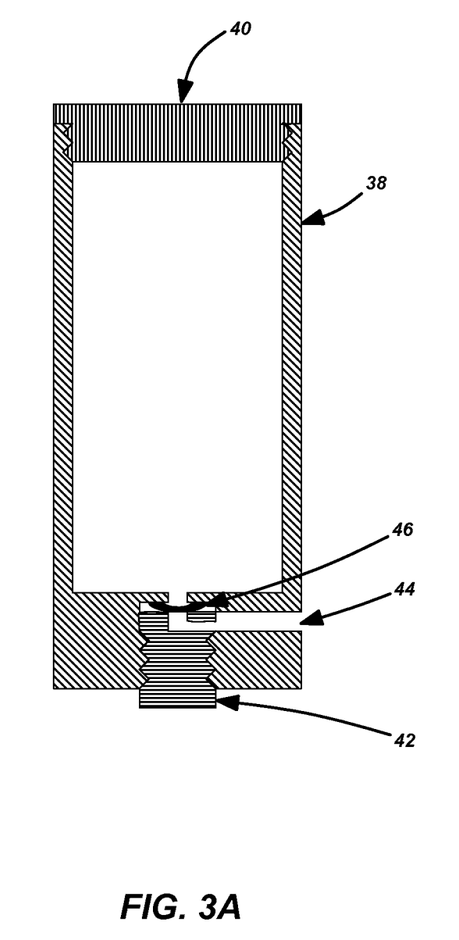
FIGS. 3A and 3B are schematic cross-sections that illustrate a first embodiment of an internal chamber used with the autoclave.
Figure 3B:
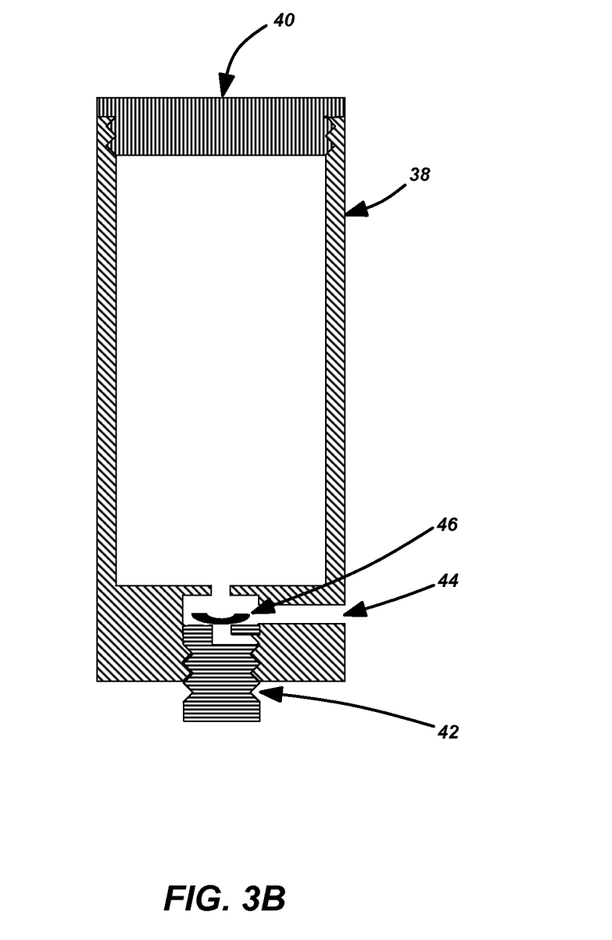

FIGS. 3A and 3B are schematic cross-sections that illustrate a first embodiment of an internal chamber 38 placed within the autoclave 18, wherein the internal chamber 38 includes a lid 40, inlet screw 42, ammonia inlet 44, and rupture disk assembly 46 that ruptures at a high pressure, e.g., when the pressure difference between the inside and outside of the chamber 38 exceeds 500 psi. In FIG. 3A, the ammonia inlet 44 is closed, while in FIG. 3B, the ammonia inlet 44 open. When the size of the internal chamber 38 is small, e.g., small enough to fit inside a glove-box, the nutrients, mineralizers, and seed crystals are loaded into the internal chamber 38 by opening the lid 40 inside a glove-box. When the size of the internal chamber 38 is too large, e.g., too large to fit inside a glove-box, the nutrients and seed crystals are loaded into the internal chamber 38 under atmosphere. Then, the top of the internal chamber 38 is covered with a glove bag (not shown), in which the lid 40 and necessary mineralizers are placed. The glove bag and the internal chamber 38 are purged with nitrogen to remove oxygen and moisture. After loading the mineralizers into the chamber 38, the lid 40 is closed. The lid 40 is leak-tight from a vacuum to at least the vapor pressure of ammonia at room temperature (~150 psi). The internal chamber 38 is cooled by immersing the top portion of the chamber 38 into liquid nitrogen or by contacting the top portion of the chamber 38 to metal tubing in which liquid nitrogen is flowing. When the chamber 38 has been filled with ammonia, the bottom inlet screw 42 is opened, as shown in FIG. 3B. The internal chamber 38 is evacuated to a vacuum through the ammonia inlet 44 and gaseous ammonia is introduced through the ammonia inlet 44. After being filled with ammonia, the inlet screw 42 is tightened, as shown in FIG. 3A. The internal chamber 38 is then set in an autoclave 18 and the autoclave 18 is tightly sealed. The autoclave 18 is heated by an external furnace to the desired temperature (typically 300~600° C.). When heated, the ammonia inside the internal chamber 38 is spontaneously pressurized and the rupture disk 46 is cracked, releasing ammonia into the autoclave 18. The autoclave 18 holds the high-pressure ammonia at high temperature and crystals are grown inside the internal chamber 38. Since the fluid flow between the inside and outside of the internal chamber 38 is restricted, impurities coming from the wall of the autoclave 18 are not incorporated into the grown crystals. By choosing an appropriate corrosion-resistant material for the internal chamber 38, the incorporation of impurities into the growing crystal can be greatly reduced.

Figure 4A:
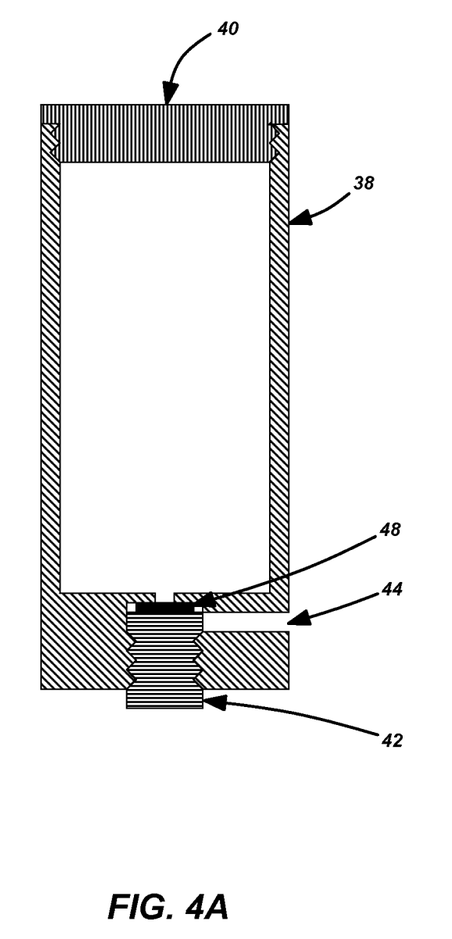
FIGS. 4A and 4B are schematic cross-sections that illustrate a second embodiment of an internal chamber used with the autoclave.
Figure 4B:
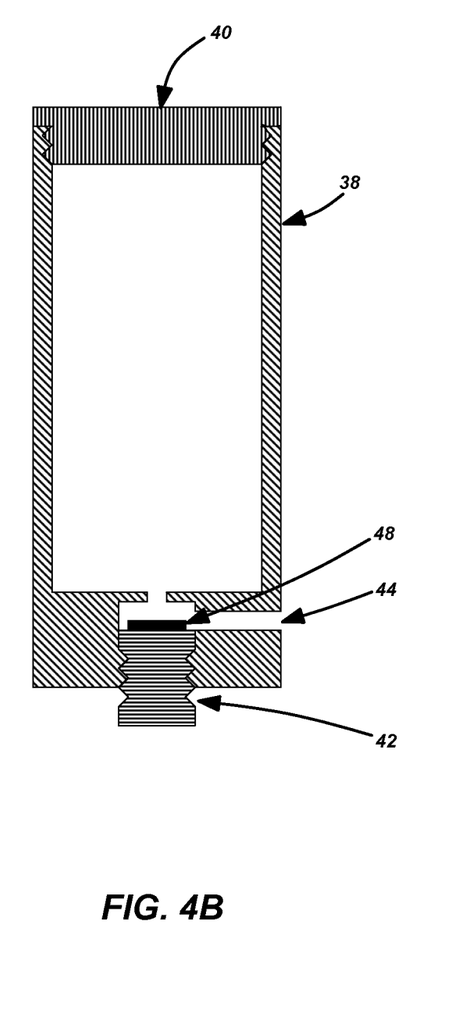

FIGS. 4A and 4B are schematic cross-sections that illustrate a second embodiment of an internal chamber 38 placed within the autoclave 18, wherein the internal chamber 38 does not include a rupture disk assembly 46, but instead includes a lid 40 with a fitting seal that leaks at a high-pressure, inlet screw 42, ammonia inlet 44, and gasket 48. In this embodiment, the ammonia inlet 44 is sealed with a gasket 48 when the inlet screw 42 is tightened. FIG. 4A shows the ammonia inlet 44 closed, while FIG. 4-B shows the ammonia inlet 44 open. The difference with the embodiment of FIGS. 3A and 3B is the leak-tightness of the lid 40. In this example, the fitting seal of the lid 40 starts to leak when the pressure difference exceeds a certain point. The leak point is designed to be higher than the vapor pressure of ammonia at room temperature (~150 psi) and lower than the burst pressure of the internal chamber 38. Similar to the procedure described for the embodiment of FIGS. 3A and 3B, the internal chamber 38 is loaded with nutrients, mineralizers and seed crystals, and filled with ammonia. Then, the internal chamber 38 is placed into an autoclave 18 and the autoclave 18 is tightly sealed. When the temperature of the autoclave 18 increases, the fitting seal of the lid 40 starts to leak the ammonia and balance the pressure between the inside and outside of the internal chamber 38. Crystals are grown inside the internal chamber 38. Since the ammonia flow and solute transfer between the inside and outside of the internal chamber 38 is restricted more than the chamber in the embodiment of FIGS. 3A and 3B, crystals containing less impurities can be grown.

Figure 5:
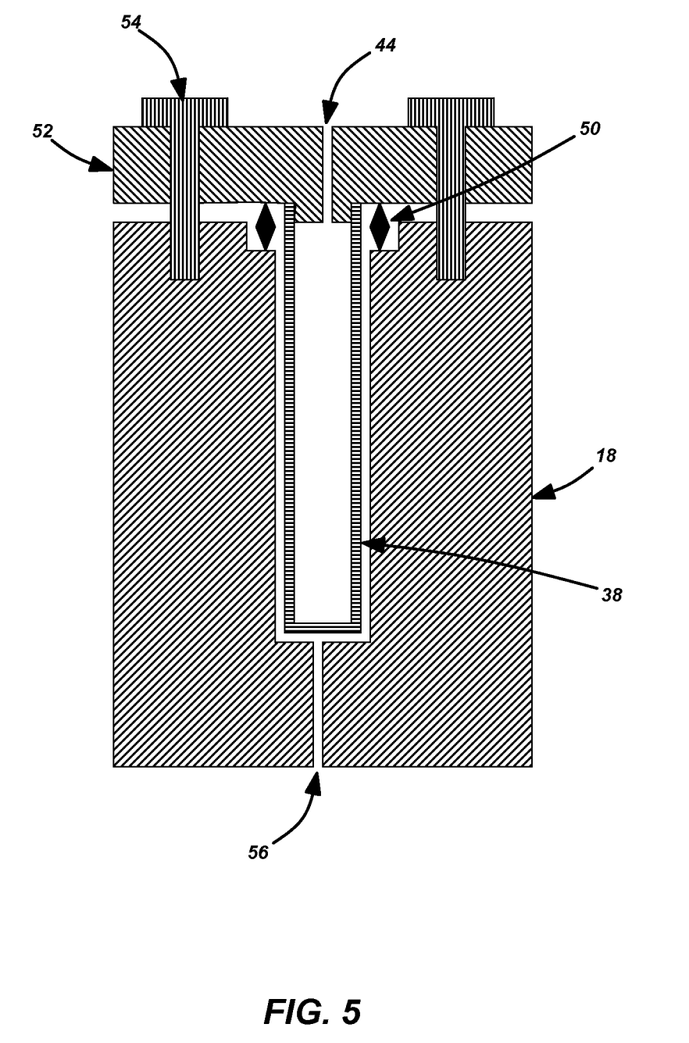
FIG. 5 is schematic cross-section that illustrates a third embodiment of an internal chamber used with a large autoclave.

FIG. 5 is schematic cross-section that illustrates a third embodiment of an internal chamber 38 placed within a large autoclave 18, wherein the internal chamber 38 includes an ammonia inlet 44, main gasket 50, autoclave lid 52, autoclave screws 54, and autoclave drain 56, and the procedure for filling ammonia into the internal chamber 38. When the internal chamber 38 is very large, it is safer and easier to fill ammonia after the internal chamber 38 is placed inside the autoclave 18. After loading all solid sources into the internal chamber 38 in a manner similar to that described in the embodiment of FIGS. 3A and 3B, the internal chamber 38 is placed in the autoclave 18. The autoclave lid 52 is closed by tightening the autoclave screws 54, and the autoclave 18 is tightly sealed with high-pressure gasket 50. The fitting seal between the autoclave lid 52 and the internal chamber 38 is tight enough to maintain a vacuum, but starts to leak at high pressure, in a manner similar to the embodiment of FIGS. 4A and 4B. The ammonia inlet 44 and the autoclave drain 56 are connected to high-pressure tubing and valves, which are not shown in the figure. The internal chamber 38 and the space between the internal chamber 38 and the autoclave 18 are evacuated through the ammonia inlet 44 and the autoclave drain 56, respectively. By keeping the space between the internal chamber 38 and the autoclave 18 at a vacuum, liquid ammonia is introduced through the ammonia inlet 44.

One benefit of this structure is that the vacuum space between the internal chamber 38 and the autoclave 18 acts as a thermal insulator. The filling of the ammonia is more efficient because cooling of the entire autoclave 18 can be avoided. After filling the ammonia, high-pressure valves (not shown) connected to the ammonia inlet 44 and the autoclave drain 56 are closed, and the autoclave 18 is heated up. When ammonia inside the internal chamber 38 is pressurized, the fitting seal between the internal chamber 38 and the autoclave lid 52 starts to leak ammonia into the space between the internal chamber 38 and the autoclave 18, and the pressure balance inside and outside of the internal chamber 38 is maintained. Crystals are grown on seeds inside the internal chamber 38.

Another embodiment uses an internal chamber 38 in the manner of FIGS. 4A and 4B, but the lid 40 is sealed with a metal seal that melts at a low temperature. Specifically, the metal seal between the internal chamber 38 and the lid 40 is soldered with indium (In). Since the melting point of In is about 157° C., the metal seal starts to leak when the autoclave 18 is heated up. After loading source materials in the same manner as the embodiment of FIGS. 3A and 3B, the lid 40 is tightened and sealed with In soldering. Then, the internal chamber 38 is filled with ammonia and placed inside the autoclave 18. When the autoclave 18 is heated, the metal seal starts to leak ammonia to balance the pressure between the inside and outside of the internal chamber 38. Crystals are grown inside the internal chamber 38, thus having less impurity.

EXPERIMENTAL RESULTS

The following describes experimental results of the present invention.

Example 1

Figure 6:
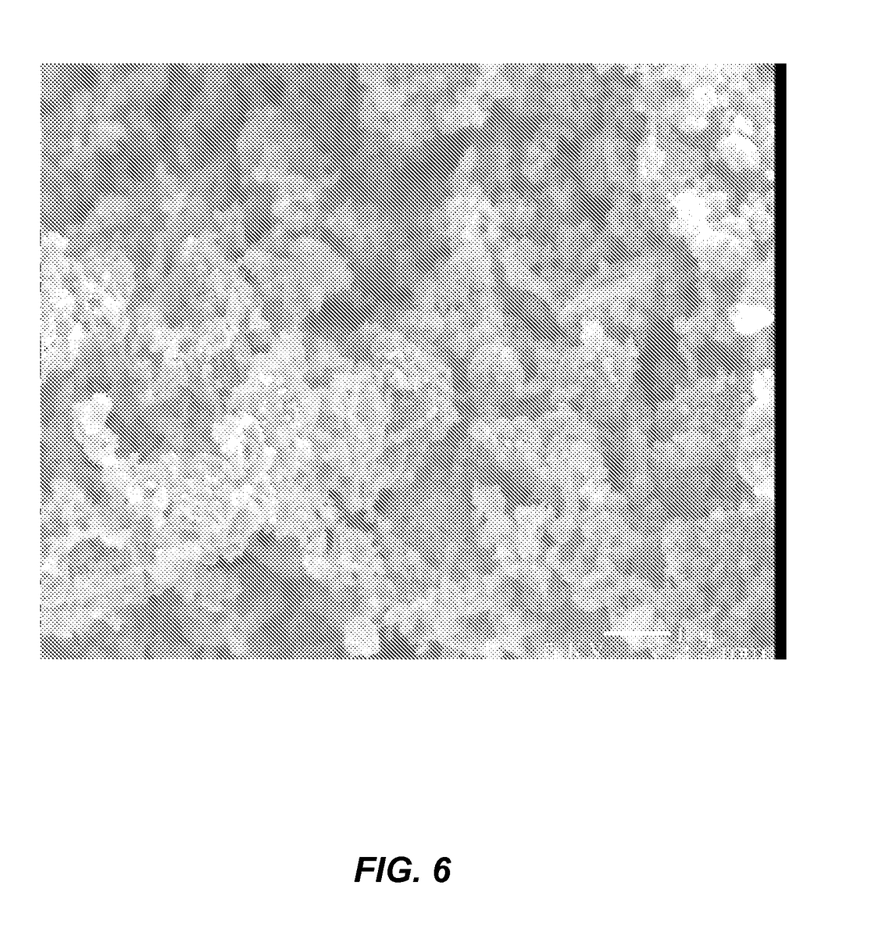
FIG. 6 is a scanning electron microscope (SEM) micrograph of a commercially available GaN powder that was used as a source material.
Figure 7:
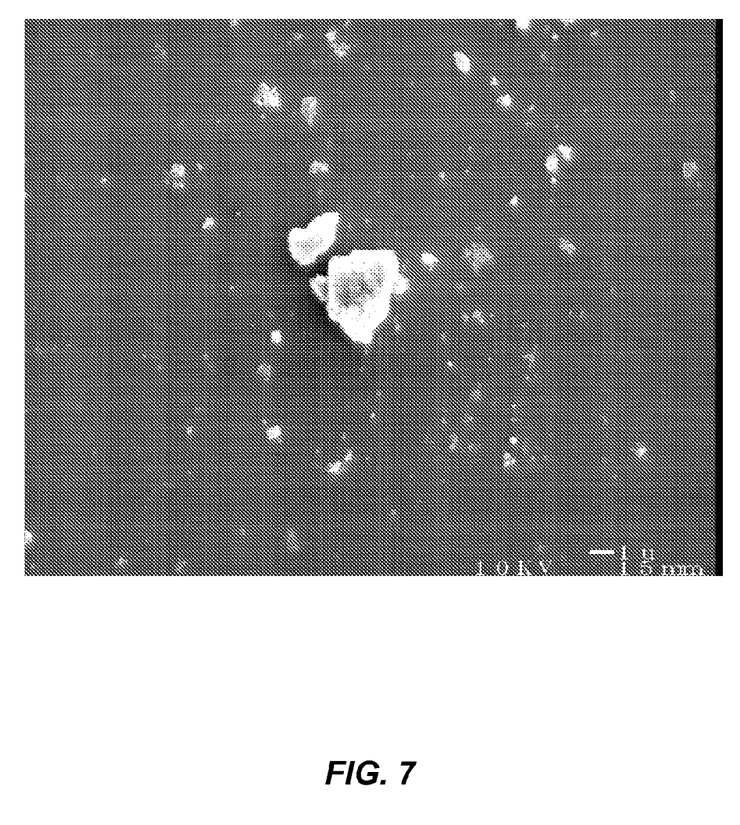
FIG. 7 is a SEM micrograph of the seed crystal after the process, wherein source material particles were seen on the seed crystal by SEM observation.

FIG. 6 is a scanning electron microscope (SEM) micrograph of a commercially available GaN powder (99.99%) that was used as a source material. 1 g of the GaN powder was placed in the bottom region of the autoclave and a single seed crystal was hung in the top region. The internal volume was about 500 ml and the amount of ammonia was about 19 g. The opening area of the baffle, which divides the inside of the autoclave into the top region and the bottom region, was about 10%. 0.5 mol % of $NaNH_2$ and 0.5 mol % of NaI were added to the ammonia as mineralizers. The top region was kept at about 540° C. The process duration was 60 hours. FIG. 7 is a SEM micrograph of the seed crystal after the process, wherein source material particles were seen on the seed crystal by SEM observation.

Example 2

Figure 8:
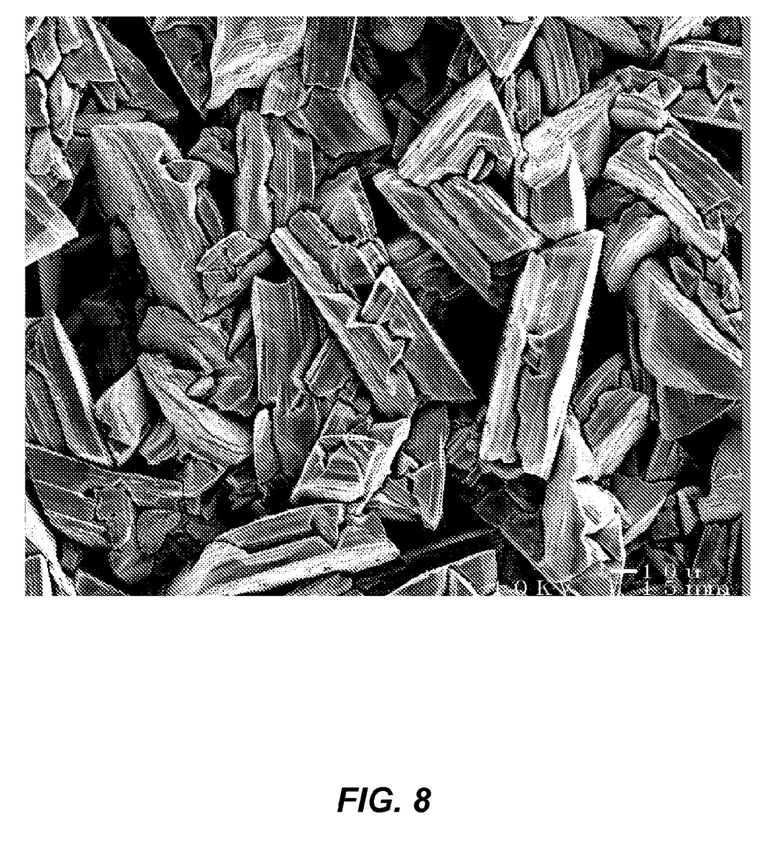
FIG. 8 is a SEM micrograph of a polycrystalline GaN for the source material synthesized by a hydride vapor phase epitaxy (HVPE) technique.
Figure 9:
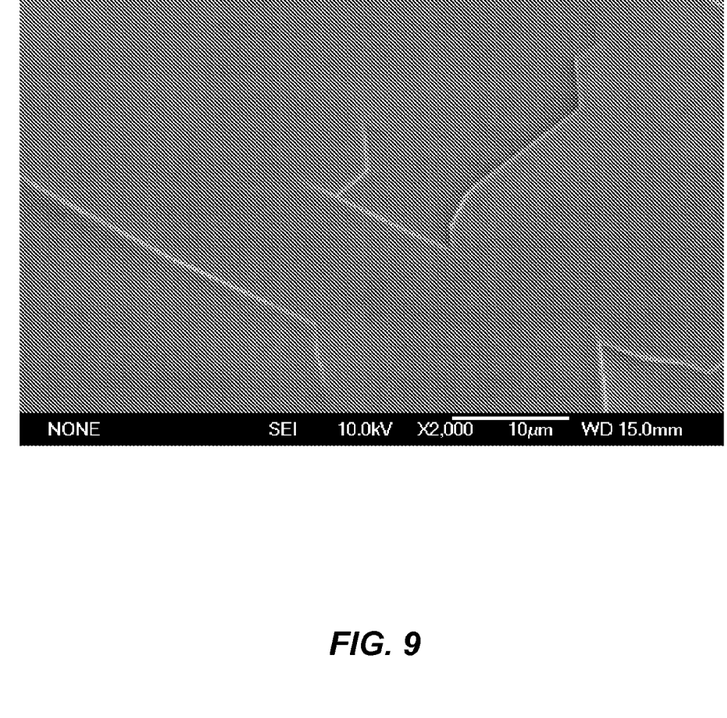
FIG. 9 is a SEM micrograph of the seed crystal after growth, wherein the weight of the seed had increased and particles from the source material were not) observed on the seed crystal by SEM observation.

FIG. 8 is a SEM micrograph of a polycrystalline GaN for the source material synthesized by a hydride vapor phase epitaxy (HVPE) technique. The obtained chunk of polycrystalline GaN was broken down into smaller pieces. The broken chunks of the polycrystalline GaN were put through a sieve and those with a size of 10 microns or more were selected. 130 g of the polycrystalline GaN was put in a mesh basket of Ni—Cr alloy (Ni content 80%) and placed in the top region of the autoclave. 2 pieces of GaN seed crystals were hung in the autoclave. The internal volume was about 500 ml and the amount of ammonia was about 80 g. The opening area of the baffle, which divides inside of the autoclave into the top region and the bottom region, was about 4.1%. 1 mol % of $NaNH_2$ and 0.05 mol % of NaI were added to ammonia as mineralizers. The top region was kept at about 530° C. and the bottom region was kept at about 550° C. The process duration was 19 days. FIG. 9 is a SEM micrograph of the seed crystal after growth, wherein the weight of the seed had increased and particles from the source material were not observed on the seed crystal by SEM observation.

Example 3

In this example, all of the polycrystalline GaN nutrient was recycled from the nutrients and fragments of grown crystals in a previous ammonothermal growth after a water rinse, drying in atmosphere at 120° C. for 1 day, and annealing in a mixture of 2% of hydrogen in nitrogen (total flow rate 1 liter/min) at 1000° C. for 4 hours. 130 g of the polycrystalline GaN was put in a mesh basket of Ni—Cr alloy (Ni content 80%) and placed in the top region of the autoclave. 2 pieces of GaN seed crystals were hung in the autoclave. The internal volume was about 500 ml and the amount of ammonia was about 80 g. The opening area of the baffle, which divides the inside of the autoclave into a top region and bottom region, was about 4.1%. 1 mol % of $NaNH_2$ and 0.05 mol % of NaI were added to ammonia as mineralizers. The top region was kept at about 530° C. and the bottom region was kept at about 550° C. The process duration was 19 days. GaN crystal similar to Example 2 was grown with much less cost than Example 2.

Advantages and Improvements

In existing methods, small particles are generated from the source materials and adhered onto the seed crystals. The present invention uses a source material wherein the grain size is at least 10 microns or more. Moreover, the present invention suppresses the generation of particles from the source material and avoids the adhesion of the particles from the source material on the seed crystals. Thus, this invention obtains high quality group III-nitride crystals.

Recycling of nutrients is very effective for cutting production costs, since both Ga and GaN are very expensive materials. The present invention provides a method for recycling GaN crystals for ammonothermal growth.

In existing methods, an internal chamber does not intentionally release ammonia, so the pressure balance must be maintained by a separate fluid filled in a space between the internal chamber and an autoclave. However, maintaining the pressure balance with a separate fluid is a delicate task and the internal chamber occasionally ruptures. In the present invention, however, the internal chamber is equipped with a pressure releasing device that enables the safe filling of ammonia and an exact balancing of the pressure between the inside and outside the internal chamber. Moreover, the internal chamber of the present invention also prevents impurities from the autoclave wall from being incorporated into grown crystals.

REFERENCES

The following references are incorporated by reference herein:

[1]. S. Porowski, MRS Internet Journal of Nitride Semiconductor, Res. 4S1, 1999) G1.3.
[2] T. Inoue, Y. Seki, O. Oda, S. Kurai, Y. Yamada, and T. Taguchi, Phys. Stat. Sol. (b), 223 (2001) p. 15.
[3] M. Aoki, H. Yamane, M. Shimada, S. Sarayama, and F. J. DiSalvo, J. Cryst. Growth 242 (2002) p. 70.
[4] T. Iwahashi, F. Kawamura, M. Morishita, Y. Kai, M. Yoshimura, Y. Mori, and T. Sasaki, J. Cryst Growth 253 (2003) p. 1.
[5] D. Peters, J. Cryst. Growth 104 (1990) pp. 411-418.
[6] R. Dwiliński, R. Doradziński, J. Garczyński, L. Sierzputowski, J. M. Baranowski, M. Kamińska, Diamond and Related Mat. 7 (1998) pp. 1348-1350.
[7] R. Dwiliński, R. Doradziński, J. Garczyński, L. Sierzputowski, M. Palczewska, Andrzej Wysmolek, M. Kamińska, MRS Internet Journal of Nitride Semiconductor, Res. 325 (1998).
[8] Douglas R. Ketchum, Joseph W. Kolis, J. Cryst. Growth 222 (2001) pp. 431-434.
[9] R. Dwiliński, R. Doradziński, J. Garczyński, L. Sierzputowski, Y. Kanbara, U.S. Pat. No. 6,656,615.
[10] Q. S. Chen et al., J. Cryst. Growth, 258 (2003) 181.
[11] A. P. Purdy et al., Cryst. Growth Design, 2 (2002) 141.
[12] E. Ohshima et al., J. Cryst. Growth, 260 (2004) 166.

Conclusion

This concludes the description of the preferred embodiment of the invention. The following describes some alternative embodiments for accomplishing the present invention.

Although the preferred embodiment describes the growth of GaN as an example, other group III-nitride crystals may be used in the present invention. The group III-nitride materials may include at least one of the group III elements B, Al, Ga, In and Tl.

Any suitable synthesis techniques of group III-nitride polycrystal can be used. The group III-nitride polycrystal synthesized from group III halides is preferably used for the purpose of the present invention.

The material of the mesh basket is not limited to a Ni or Ni alloy that contains at least 30% of Ni. Moreover, the shape and size of the mesh is not especially limited, if the mesh can hold the source material.

In the example, $NaNH_2$ together with NaI is added as mineralizer. $NaNH_2$ can be replaced with other alkali amides, such as $LiNH_2$ and $KNH_2$. Moreover, the results of the present invention are the same even if NaI is not added, although NaI enhances the dissolving process of the source material. In addition, other alkali halides, such as NaBr, NaCl, KI, KBr, KCl, LiI, LiBr, or LiCl, can also be used.

In the exemplary embodiments of the autoclave, specific internal chamber structures are presented. However, other constructions or designs that fulfill the conditions described herein will have the same benefit as these examples.

The present invention does not have any limitations on the size of the autoclave, so long as the same benefits can be obtained.

The internal chamber can be made of any metals that are corrosion resistant to ammonia, such as Ni-based super alloys, W-based alloys, Mo-based alloys, Co-based alloys, Cu-based alloys, Al-based alloys, and Mg-based alloys. In the case of acidic ammonia, noble metals such as Pt, Pd, Ag, Au can be used.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for growing group III-nitride crystals, comprising:
    (a) loading source materials and seed crystals into a reaction vessel, wherein part or all of the source materials are prepared by a recycling process for a nutrient used in a previous ammonothermal process or fragments of the group III-nitride crystals grown in the previous ammonothermal process and the recycling process includes annealing the nutrients or the fragments at more than 600° C. in a reducing environment;
    (b) filling the reaction vessel with ammonia; and
    (c) raising the reaction vessel's temperature to attain a supercritical state for the ammonia wherein convection of the supercritical ammonia transfers the source materials and deposits the transferred source materials onto the seed crystals.

2. The method of claim 1, wherein the source materials have a grain size of at least 10 microns.

3. The method of claim 1, wherein the source materials are a group-III nitride polycrystals.

4. The method of claim 3, wherein the group III-nitride polycrystals are synthesized from group III halides.

5. The method of claim 4, wherein the group III-nitride is GaN.

6. The method of claim 1, wherein the source materials are a group-III metal.

7. The method of claim 1, wherein the source materials are a mixture of group-III metal and group-III nitride polycrystals.

8. The method of claim 7, wherein the group III-nitride is GaN.

9. The method of claim 1, wherein the seed crystals are group-III nitride crystals.

10. The method of claim 1, wherein the reducing environment contains hydrogen or ammonia.

11. The method of claim 1, wherein the reaction vessel has longer dimension along the vertical direction, the reaction vessel is divided into a top region and a bottom region with a baffle plate therebetween, the source materials and seed crystals are placed in separate ones of the top and bottom regions, and the top region is kept at a different temperature than the bottom region.

12. The method of claim 1,
wherein the source materials are held in a mesh basket and the mesh basket is made of Ni or Ni-based alloy that contains at least 30% of Ni.

13. The method of claim 1, wherein undissolved particles of the source materials are prevented from being transferred and deposited on the seed crystals during the convection of the supercritical ammonia.

14. A method for growing group III-nitride crystals, comprising:
   (a) loading source materials and seed crystals into a reaction vessel;
   (b) filling an internal chamber of the reaction vessel with ammonia;
   (c) raising the reaction vessel's temperature to attain a supercritical state for the ammonia, wherein convection of the supercritical ammonia transfers the source materials and deposits the transferred source materials onto the seed crystals; and
   (d) releasing the ammonia from the internal chamber into the reaction vessel, when the ammonia attains the supercritical state, such that the released ammonia fills a space between the internal chamber's outer walls and the reaction vessel's inner walls, to balance the pressure between inside and outside of the internal chamber.

15. The method of claim 14, wherein the source materials are held in a mesh basket and the mesh basket is made of Ni or Ni-based alloy that contains at least 30% of Ni.

* * * * *

UNITED STATES PATENT AND TRADEMARK OFFICE
CERTIFICATE OF CORRECTION

PATENT NO.        : 8,709,371 B2
APPLICATION NO.   : 11/921396
DATED             : April 29, 2014
INVENTOR(S)       : Fujito et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 568 days.

Signed and Sealed this
Twenty-ninth Day of September, 2015

Michelle K. Lee
*Director of the United States Patent and Trademark Office*